METHOD OF MAKING SEMICONDUCTOR DEVICES BY FORMING A DAMAGE LAYER ON A SURFACE OF A SEMICONDUCTOR BODY AND THEN ALLOYING THROUGH SAID DAMAGE LAYER

Filed Nov. 21, 1962

INVENTORS
YOSHINORI MIHARA
SUSUMU KITAJIMA
SHIGERU ABE
BY
Hopgood & Calimafde
ATTORNEYS United States Patent Office 3,232,800

Patented Feb. 1, 1966

3,232,800

METHOD OF MAKING SEMICONDUCTOR DEVICES BY FORMING A DAMAGE LAYER ON A SURFACE OF A SEMICONDUCTOR BODY AND THEN ALLOYING THROUGH SAID DAMAGE LAYER

Yoshinori Mihara, Susumu Kitajima, and Shigeru Abe, Tokyo, Japan, assignors to Nippon Electric Company Limited, Tokyo, Japan, a corporation of Japan Filed Nov. 21, 1962, Ser. No. 239,174

Claims priority, application Japan, Dec. 16, 1961, 36/45,750

1 Claim. (Cl. 148—179)

This invention relates to the manufacture of semiconductor devices and particularly to an improved method of manufacture therefor.

Heretofore, in the manufacture of semiconductor devices by the alloying method, it has been the general practice to chemically etch the surface of the semiconductor after the mechanical operation of cutting, polishing and lapping the semiconductor crystal, in order to remove the damaged layer produced by mechanical processing. The purpose of the etching step is based on the theory that in the course of melting an impurity or foreign metal into the germanium, the melting is uniformly performed only if the crystal is perfect. Such uniform melting will produce a uniform alloy front or PN junction portion when completed.

In this connection, however, it is essential that the foreign metal unite with the semiconductor surface completely and simultaneously over the entire surface. In actual practice, however, it is difficult to completely cleanse the surfaces of the semiconductor and the foreign metal either mechanically or chemically. Accordingly, the alloying usually starts in an incomplete wetted condition and proceeds irregularly, and sometimes alloying is not performed at all due to the existence of residual contamination on the semiconductor surfaces, or due to bubbles formed between the surface and the metal, and as a consequence the desired uniform and even junction front is not achieved. Accordingly, the presence of contamination will often cause leakage currents and as a result it is difficult to actually achieve the theoretically calculated reverse voltage from the specific resistance of the semiconductor material, a still further undesirable effect being produced in that the breakdown voltage curve becomes distorted.

Accordingly, it is a principal object of this invention to provide a method for eliminating the above mentioned disadvantages of the prior art.

All of the objects, features and advantages of this invention and the manner of attaining them will become more apparent and the invention itself will be best understood by reference to the following description of an embodiment of the invention taken in conjunction with the accompanying drawing, in which.

In the various figures like numerals indicate like parts or portions.

According to the invention, the crystal damage layer that was previously regarded undesirable and to be eliminated, is now utilized to advantage. Accordingly, keeping in mind that, in a crystal damage layer, the alloying and chemical etching velocity is approximately two times the rate of that in the case of a complete crystal, the semiconductor pellet is alloyed without subjecting it to etching immediately after the surface is mechanically polished and lapped to the desired degree of fineness, and a semiconductive device having superior reverse voltage characteristics is thereby successfully obtained. By this method an irregular alloy front is produced just beneath the thin crystal damage layer surface of the semiconductor, however such irregularity is immediately removed due to the fact that the alloying velocity is faster within the damage layer, and during the progress of alloying in this layer, the alloy front becomes uniform and flat, and an ideal alloying condition is obtained when the alloy front transfers from the damage layer to the complete layer. The alloying is stopped after it penetrates into the complete layer to a small degree, so that an ideal alloyed semiconductor is thus obtained.

Figure 1:
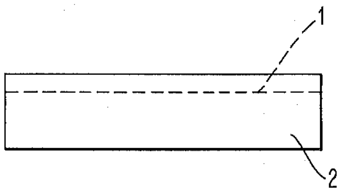
FIG. 1 is a sectional view of a semiconductor crystal pellet after mechanical processing.
Figure 2:
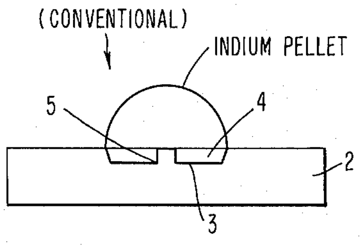
FIG. 2 is a sectional view of the pellet after alloying according to the conventional method.
Figure 3:
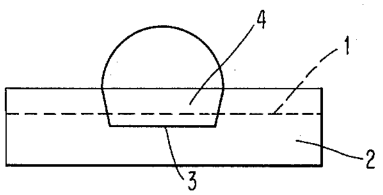
FIG. 3 shows a section after alloying according to the present invention.
Figure 4:
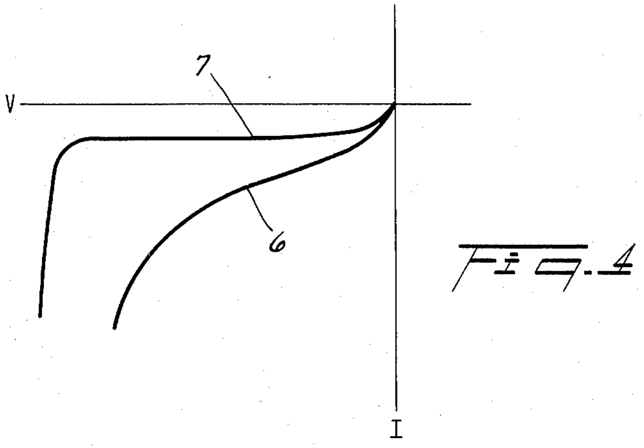
FIG. 4 is a graph showing a comparison of breakdown voltage characteristics.

Referring now to FIG. 1, which shows a section of a semiconductor pellet after mechanical process according to this invention, the numeral 1 designates a damage layer, and the numeral 2 designates the complete layer. FIG. 2 is a section of the alloyed pellet after the damage layer is chemically etched out according to the conventional method, in which the numeral 4 designates a recrystallization layer after alloying, numeral 3 designates the junction front, and numeral 5 designates the irregular alloy front due to bubbles, etc., as explained elsewhere in the specification. FIG. 3 is a section of the device according to the invention, in which, numeral 1 indicates the damage layer, numeral 2 indicates the complete layer and numeral 3 indicates the junction front. FIG. 4 shows the break-down voltage curve of the finished semiconductor, the abscissa representing the voltage values V while the ordinate represents the current values I. The curve 6 of FIGURE 4 shows the break-down voltage characteristic of a semiconductor manufactured in accordance with the conventional method and curve 7 shows the break-down voltage characteristic of a semiconductor manufactured according to the present invention.

A specific exemplary embodiment of this invention will now be described, in which, for example, N-type germanium of 5 ohm-centimeter specific resistance of 2.0 mm. thickness is employed as the semiconductor. This semiconductor is then polished to a thickness of 0.6 millimeter by a suitable abrasive such as that known in the trade as Carborundum No. 1200, further polishing to a 0.35 millimeter thickness by Carborundum No. 3000, and then to a thickness of 0.28 millimeter by Carborundum No. 4000. It is then lapped to a 0.25 millimeter thickness by alumina such as that known by the trade name Linde A. After being subjected to the above mechanical treatments, the semiconductor is alloyed with a suitable metal such as indium. The sample thus obtained and a sample obtained by the conventional method which was chemically etched after polishing by means of a solution of hydrogen peroxide and hydrofluoric acid, were subjected to a reverse voltage test at a current of 100 microamperes. This test indicated a value of 170 volts for the sample manufactured according to this invention and a value of 110 volts for the sample manufactured according to the conventional method.

Further experimentation shows that substantially the identical results obtained in the case of the chemical etching can be achieved through the polishing process by the use of Carborundum No. 3000 abrasive, and that substantially the identical results obtained by the process employing the Linde-A alumina could be obtained by finishing with Carborundum abrasive up to No. 4000. Accordingly, the superior results achieved according to the invention as described above can also be attained by the use of Carborundum abrasive of the order of No. 4000. It is also possible to achieve the same result by finishing with Carborundum No. 4000, after polishing by means of the conventional chemical etching instead of employing the polishing process with the aid of Carborundum No. 3000. The present invention is, of course, applicable to other types of semiconductor materials besides germanium and various alloying metals may also be employed.

While the foregoing description sets forth the principles of the invention in connection with specific apparatus, it is to be understood that the description is made only by way of example and not as a limitation of the scope of the invention as set forth in the objects thereof and in the accompanying claim.

What is claimed is:

In the method of making a semiconductor device by forming a damage layer on a surface of a semiconductor body and then alloying through said damage layer with an impurity to produce a uniform alloy front whereby a p-n junction is formed in said body, the improvement comprising forming the damage layer by first polishing a surface of the semiconductor body with an abrasive of Carborundum material in a plurality of controlled polishing steps, each successive step being carried out with a finer grade of abrasive material than the immediately preceding step, and subsequently lapping the polished surface with an ultra-fine abrasive of alumina material prior to the alloying step, to substantially improve the reverse voltage breakdown characteristic of said device by a voltage figure of at least approximately 50% at a given current value over that obtainable by the method wherein said damage layer is removed by etching before the alloying step.

References Cited by the Examiner

UNITED STATES PATENTS

| | | | |
|---|---|---|---|
| 2,900,584 | 8/1959 | Bottom | 148—179 |
| 3,009,841 | 11/1961 | Faust | 148—179 |

DAVID L. RECK, *Primary Examiner.*

HYLAND BIZOT, *Examiner.*